March 18, 1952 H. A. BROOS 2,589,331

RADIO-FREQUENCY RECEIVER WITH BAND-SPREAD TUNING

Filed April 26, 1946

INVENTOR.
HENDRICUS ADRIANUS BROOS
BY Fred M Vogel
AGENT.

Patented Mar. 18, 1952 2,589,331

UNITED STATES PATENT OFFICE 2,589,331

RADIO-FREQUENCY RECEIVER WITH BAND-SPREAD TUNING

Henricus Adrianus Broos, Eindhoven, Netherlands, assignor, by mesne assignments, to Hartford National Bank and Trust Company, Hartford, Conn., as trustee Application April 26, 1946, Serial No. 665,033
In the Netherlands November 12, 1942

Section 1, Public Law 690, August 8, 1946
Patent expires November 12, 1962

3 Claims. (Cl. 250—40)

Figure 1:
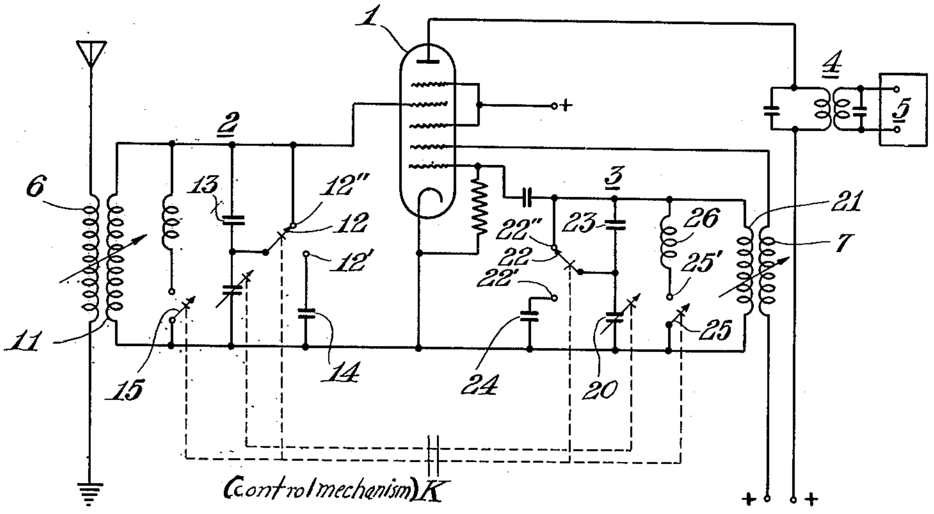

This invention relates to a wireless receiver which is continuously tunable over one or more comparatively wide wavebands and in addition tunable with bandspreading in one or more comparatively narrow short wave bands.

In order to secure a simple control of the receiver it is preferred to use the same variable condenser for the tuning with bandspreading in the comparatively narrow short wave bands as for the continuous tuning in the comparatively wide wavebands. It is known to secure a bandspreading in this manner by connecting one or more fixed condensers in the oscillatory circuit to be tuned in series with and/or in parallel with the variable condenser.

If a wireless receiver constructed in the above described manner is desired to be tuned to a short-wave broadcasting station the receiver should previously be adjusted to bandspread tuning for the short-wave band concerned by means of a switch. For a receiver which is continuously tunable for example over five comparatively wide wave bands and in addition tunable with bandspreading in for example five comparatively narrow short-wave bands this entails the necessity of operating in addition to a wavelength switch having five positions for continuous tuning a switch having five positions for the bandspread tuning.

The present invention provides a means of avoiding this involved control. For this purpose, in a wireless receiver which is continuously tunable over one or more comparatively wide wavebands and in addition tunable with bandspreading in one or more comparatively narrow short-wave bands and in which in at least one oscillatory circuit the bandspread tuning is effected by means of the same variable condenser as that which serves for the continuous tuning, and in series with which and/or in parallel with which a fixed condenser is connected for this purpose, use is made of a variable condenser whose capacity has at least two minimum or two maximum values within the variation range of the condenser, means being provided which as a maximum or minimum capacity of the variable condenser is passed change the connection of the wireless receiver from continuous tuning to bandspread tuning or conversely.

It has been suggested that in a wireless receiver having a long-wave band and a medium-wave band use should be made of a variable condenser capable of being rotated through any angle and hence also through an angle exceeding 360°. The shaft of this condenser has seated on it a switch which brings about the change of connection from the long-wave band to the medium-wave band when the condenser is turned so as to pass trough the position that corresponds to its maximum capacity.

In the receiver according to the invention, for passing from continuous tuning to bandspread tuning there is therefore no need to operate a supplementary switch since the control of the condenser has the effect of bringing about the change of connections from continuous tuning to bandspread tuning at the correct moment. This may be secured in a simple manner by providing a mechanical coupling between the condenser and the switch that brings about the required change of connections.

Preferably, use is made of a variable condenser whose capacity within the variation range has only two minimum and maximum values respectively and in which the change of connections from continuous tuning to bandspread tuning ensues at the moment at which the condenser is moved through the position that corresponds to its maximum or minimum capacity respectively. Thus, during a complete variation of the variable condenser, the receiver is successively tuned continuously to one comparatively wide-wave band and with bandspreading to one comparatively narrow short-wave band. This permits of the wide wave band and the (associated) narrow short wave band being efficaciously indicated on the tuning dial side by side. Each of the various wide-wave bands into which the entire frequency band to be received is divided with the associated narrow short-wave band may be adjusted at will by means of the wavelength switch.

In the receiver according to the invention use may be made with advantage of a variable condenser having a comparatively low maximum capacity, for example 140 $\mu\mu$f. In the usual wireless receivers it is endeavoured to increase the ratio between maximum and minimum capacity of the variable condenser as far as possible within certain limits in order to permit of the frequency range to be received altogether being subdivided into a minimum number of wave bands so that the control of the receiver stays simple. The requirement of the small number of wave bands is even more stringent if such receivers are constructed with bandspreading since otherwise, as set out hereinbefore, the control becomes highly involved. The use of condensers having a high maximum capacity is, however, from the view point of material consumption (particularly of copper consumption) less economical than the use of a condenser having a comparatively low final capacity. In addition, the use of a condenser having a low maximum capacity even offers further advantages set out hereinafter.

The present invention permits of constructing a bandspread wireless receiver with the use of a variable condenser having a low maximum capacity, for example 140 $\mu\mu$f., without the control becoming more involved. Indeed, in the receiver according to the invention, it is possible to divide the entire frequency range to be received without any complication into as many wide wave bands as there are narrow short-wave bands with bandspreading to be tuned. Generally, bandspreading is used in five or preferably in six narrow short-wave bands so that it is also possible to divide the total frequency range over which the receiver is continuously tunable into five or six respectively wide wavebands without the need for a supplementary switch being controlled.

In the subjoined Tables I and II are indicated some few examples of combinations of wide wave bands and narrow short-wave bands which, with the use of a condenser having a low maximum capacity (about 140 $\mu\mu$f.), can be secured.

*Table I*

| Short wave band | Wide wave range |
|---|---|
| 13 meters | from 13 to 25 meters. |
| 16 meters | from 25 to 45 meters. |
| 19 meters | from 185 to 318 meters. |
| 25 meters | from 318 to 588 meters. |
| 30 meters | from 108 to 1310 meters. |
| From 40 to 55 meters | from 1310 to 2000 meters. |

*Table II*

| Short wave band | Wide wave range |
|---|---|
| 13 meters | from 13 to 25 meters. |
| 16 meters | from 25 to 45 meters. |
| 19 meters | from 55 to 100 meters. |
| 25 meters | from 100 to 185 meters. |
| 30 meters | from 185 to 318 meters. |
| From 40 to 55 meters | from 318 to 588 meters. |

In the distribution of the wide wave bands according to Table I are to be found side by side on the tuning dial for example the short wave band of 13 meters with bandspreading and the wide wave range from 13 to 25 meters with continuous tuning; the short wave band of 16 meters with bandspreading and the wide wave band of from 25 to 45 meters with continuous tuning and so forth. Table I gives a distribution of the wave bands which is usual in Europe, whereas Table II indicates a distribution for a wireless receiver without long-wave reception. For comparison, Table III indicates in addition a division of the entire frequency range to be received into five wave bands for a receiver in which a condenser having a maximum capacity of about 500 $\mu\mu$f. is used. In this case the narrow short wave band of from 48 to 55 meters cannot be received with bandspreading but this is not often necessary.

*Table III*

| Short wave band | Wide wave range |
|---|---|
| 13 meters | from 13 to 45 meters. |
| 16 meters | from 42 to 110 meters. |
| 19 meters | from 100 to 300 meters. |
| 25 meters | from 300 to 700 meters. |
| 30 meters | from 700 to 2200 meters. |

The use of a variable condenser having a low maximum capacity introduces a considerable economy of material (copper) and also a saving in space with the result that the receiver can be constructed so as to be more compact and hence less expensive. The comparatively wide wavebands which can be covered by continuous tuning by means of a condenser having a low maximum capacity are about 1½ times smaller than those that can be reached by the use of a normal condenser having a high maximum capacity. The use of these smaller wave bands offers the advantage that the various oscillatory circuits can be adjusted and adapted more readily. In a wireless superheterodyne receiver it is for example easier to reach a constant difference between the oscillator frequency and the tuning frequency of the input circuits. The aerial circuit can also be varied more efficiently to accord with the input oscillatory circuit so that a higher signal voltage is induced in the input circuit and the signal to noise ratio becomes considerably more favourable.

In order that, in the case of bandspread tuning a more uniform distribution of the short-wave broadcasting transmitters about the tuning dial may be secured the fixed plates of the variable condenser are preferably shaped in such a form that in the case of a variation of the condenser position adjacent the minimum capacity value the capacity varies but slowly.

Figure 2:
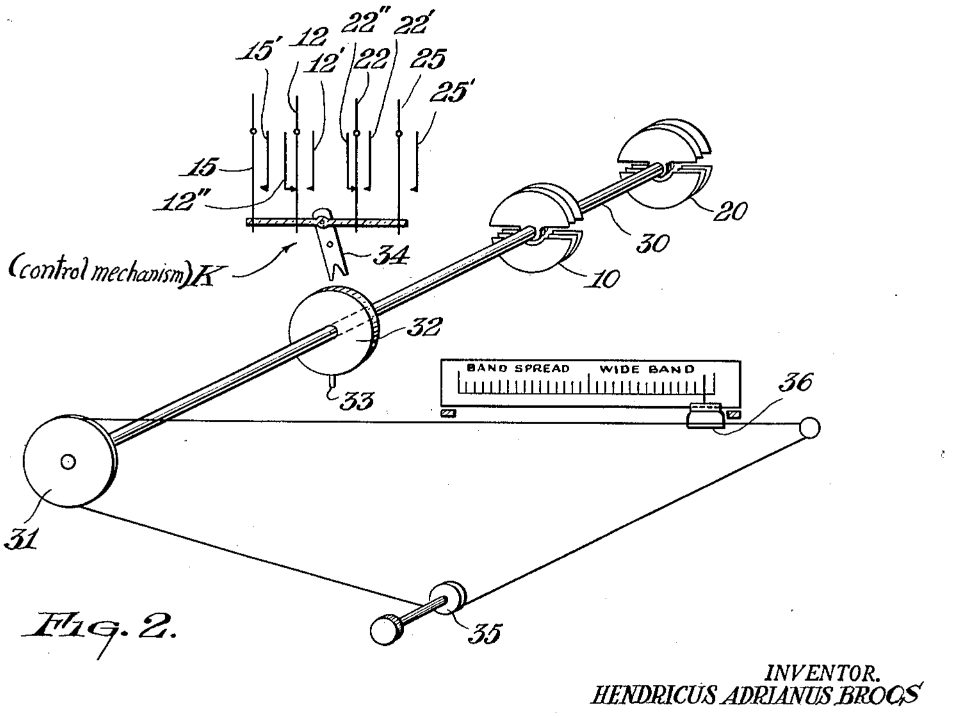

In order that the invention may be clearly understood and readily carried into effect it will now be described more fully with reference to the accompanying drawing in which:

Figure 1 is a schematic diagram of the tunable stages of a radio receiver in accordance with the invention, and Figure 2 illustrates one form of mechanical interconnection of the tuning elements in accordance with the invention.

Referring to the Fig. 1, 1 designates a mixing tube of the penta-grid type having connected to it a pre-selection circuit 2 and an oscillator circuit 3. The anode circuit of the mixing valve 1 is coupled with the interposition of a medium frequency bandfilter 4 to the remaining part 5 of the receiver. Each of the circuits 2 and 3 comprises a tuning condenser 10 and 20 respectively and a coil 11 and 21 respectively, the first-mentioned coil being coupled to a coil 6 included in the aerial circuit and the last-mentioned coil to a feedback coil 7. For continuous tuning over a wide waveband the tuning condenser is coupled directly parallel with the associated coil in each of the circuits, as may be seen from Fig. 1 in which the switches 15 and 25 are in the open condition, the switch 12 blade engages the contact 12'' and the switch blade 22 engages the contact 22''.

For tuning with bandspreading, the tuning condensers 10, 20 are connected by means of switches 12 and 22 engaging contacts 12' and 22' respectively in series with fixed condensers 13 and 23 respectively and in parallel with fixed condensers 14 and 24 respectively so that the frequency region covered in the case of a maximum variation of the tuning condenser is greatly limited. In addition, inductance coils 16 and 26 respectively are connected in parallel with the coils 11 and 21 by means of switches 15 and 25 engaging the contacts 15′ and 25′ respectively. In the figure, only the change of connections from one wide wave band with continuous tuning to a narrow short-wave band with bandspreading is shown. If more than one wide wave band with associated narrow short-wave band is present the circuit arrangement is extended in a similar manner. The switches 15, 25, 12 and 22 are relatively coupled mechanically, as is indicated in the figure by a dotted line; the same remark applies to the tuning condensers 10 and 20. The said switches are mechanically coupled with the condensers 10 and 20 in such manner that the switches are inverted at the moment when the condensers pass their maximum capacity value. This coupling is diagrammatically shown in Fig. 1 of the drawing by two parallel dashes K.

One form of construction for mechanically interconnecting the switches 12, 15, 22 and 25 is shown in Fig. 2. As shown, the variable condensers 10 and 20 are mounted on a common shaft 30 to which a suitable drive mechanism including pulley 31 is converted. The condensers 10 and 20 are rotatable through 360° so that two ranges of capacity variation are produced for a complete revolution of the rotor thereof. Mounted on the shaft 30 is a cam 32 having a cam pin 33 which engages the notch of the toggle lever 34. The toggle lever 34 is shown in the wide band tuning position whereby switches 15 and 25 are in the open position, the switch blade 12 engages the contact 12″ and the switch blade 22 engages the contact 22″. This position corresponds to the position of the switches shown in Fig. 1.

Upon rotation of the tuning knob 35 which moves the dial pointer 36 towards the left the shaft 30 is rotated counterclockwise thereby progressively increasing the capacity of condensers 10 and 20 to the position of maximum capacity value. At this point, continued rotation of the shaft 30 causes the pin 33 to engage the notch of the toggle lever 34 whereby the switch blade 15 engages the contact 15′, the switch blade 12 engages the contact 12′, the switch blade 22 engages the contact 22′ and the switch blade 25 engages the contact 25′. At this point, the tuning system is in the band spread position and further rotation of the condenser rotors brings about a progressive decrease in capacity value under band spread conditions.

What I claim is:

1. A radio receiver continuously tunable over a wide frequency band and tunable with bandspreading over a relatively narrow frequency band, comprising a variable tuning capacitor having two variations of its capacitive range within its total mechanical range of variation, a fixed capacitor, an inductance element, switching means selectively to couple said variable capacitor to said inductance element to produce a resonant circuit tunable over a first frequency range and to couple said variable capacitor and said fixed capacitor to said inductance element to produce a resonant circuit tunable over a second frequency range, said second frequency range being relatively narrow with respect to said first frequency range, means coupled to said variable capacitor to vary the same through its said range of variation, and means actuated by said capacitor variation means to actuate said switching means to switch said circuits at a position of said variable capacitor at which a predetermined capacity value of said variable capacitor is provided.

2. A radio receiver continuously tunable over a wide frequency band and tunable with bandspreading over a relatively narrow frequency band, comprising a variable tuning capacitor having two variations of its capacitive range within its total mechanical range of variation, a fixed capacitor, an inductance element, switching means selectively to couple said variable capacitor across said inductance element to produce a resonant circuit tunable over a first frequency range and to couple said variable capacitor and said fixed capacitor in series across said inductance element to produce a resonant circuit tunable over a second frequency range, said second frequency range being relatively narrow with respect to said first frequency range, means coupled to said variable capacitor to vary the same through its said range of variation, and means actuated by said capacitor variation means to actuate said switching means to switch said circuits at a position of said variable capacitor at which an extremum capacity value of said variable capacitor is provided to tune said receiver over a wide frequency band and over a relatively narrow frequency band successively.

3. A radio receiver continuously tunable over a wide frequency band and tunable with bandspreading over a relatively narrow frequency band, comprising a rotatable tuning capacitor providing two variations of its capacitive range for each complete rotation, a fixed capacitor, an inductance element, switching means selectively to couple said rotatable capacitor across said inductance element to produce a resonant circuit tunable over a first frequency range and to couple said rotatable capacitor and said fixed capacitor in series across said inductance element to produce a resonant circuit tunable over a second frequency range, said second frequency range being relatively narrow with respect to said first frequency range, means coupled to said rotatable capacitor to vary the same through its said range of variation, and means actuated by said capacitor variation means to actuate said switching means to switch said circuits at a position of said tuning capacitor at which an extremum capacity value of said variable capacitor is provided to tune said receiver successively over a wide frequency band and over a narrow frequency band.

HENRICUS ADRIANUS BROOS.

REFERENCES CITED

The following references are of record in the file of this patent:

UNITED STATES PATENTS

| Number | Name | Date |
|---|---|---|
| 2,238,752 | Rina et al. | Apr. 15, 1941 |
| 2,434,299 | Van Loon | Jan. 13, 1948 |
| 2,470,426 | Benin | May 17, 1949 |

FOREIGN PATENTS

| Number | Country | Date |
|---|---|---|
| 135,515 | Austria | Nov. 25, 1933 |
| 194,606 | Switzerland | Mar. 1, 1938 |
| 490,206 | Great Britain | Aug. 8, 1938 |
| 551,064 | Great Britain | Feb. 5, 1943 |

OTHER REFERENCES

"Automatic Bandspread," Radio, March 1936, page 19.